(12) United States Patent
Bedell et al.

(10) Patent No.: US 8,368,143 B2
(45) Date of Patent: Feb. 5, 2013

(54) STRAINED THIN BODY SEMICONDUCTOR-ON-INSULATOR SUBSTRATE AND DEVICE

(75) Inventors: Stephen W. Bedell, Wappingers Falls, NY (US); Kangguo Cheng, Guilderland, NY (US); Bruce B. Doris, Albany, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/301,360

(22) Filed: Nov. 21, 2011

(65) Prior Publication Data

US 2012/0074494 A1 Mar. 29, 2012

Related U.S. Application Data

(62) Division of application No. 12/892,950, filed on Sep. 29, 2010, now Pat. No. 8,124,470.

(51) Int. Cl.
*H01L 27/12* (2006.01)

(52) U.S. Cl. ........ 257/347; 257/183; 257/184; 257/192; 257/200; 438/46; 438/48; 438/60; 438/93

(58) Field of Classification Search .................. None
See application file for complete search history.

(56) References Cited

U.S. PATENT DOCUMENTS

| | | | |
|---|---|---|---|
| 6,680,495 B2 * | 1/2004 | Fitzergald | ..................... 257/183 |
| 6,765,227 B1 | 7/2004 | Yu et al. | |
| 6,921,914 B2 | 7/2005 | Cheng et al. | |
| 7,029,994 B2 | 4/2006 | Ge et al. | |
| 7,235,812 B2 | 6/2007 | Chu et al. | |
| 7,238,989 B2 | 7/2007 | Yeo et al. | |
| 7,354,809 B2 | 4/2008 | Yuan et al. | |
| 7,402,466 B2 | 7/2008 | Chan et al. | |
| 7,524,707 B2 | 4/2009 | Adetutu et al. | |
| 2002/0123167 A1 | 9/2002 | Fitzgerald | |
| 2008/0254594 A1 | 10/2008 | Chan et al. | |
| 2009/0173939 A1 | 7/2009 | Berg et al. | |

OTHER PUBLICATIONS

L.K. Bera et al., A Dual-Strained CMOS Structure Through Simultaneous Formation of Relaxed and Compressive Strained-SiGe-On-Insulator, IEEE Electron Device Letters, vol. 27, No. 5, May 2006, pp. 350-353.

Tomohisa Mizuno et al., Advanced SOI p-MOSFETs With Strained-Si Channel on SiGe-On-Insulator Substrate Fabricated by SIMOX Technology, IEEE TRansactions on Electron Devices, vol. 48., No. 8, Aug. 2001, pp. 1612-1618.

C. Mazure et al., Advanced SOI Substrate Manufacturing, IEEE Conference on Integrated Circuit Design and Technology, 2004, pp. 105-111.

(Continued)

*Primary Examiner* — Kyoung Lee
(74) *Attorney, Agent, or Firm* — Cantor Colburn LLP; Catherine Ivers

(57) ABSTRACT

A method of forming a strained, semiconductor-on-insulator substrate includes forming a second semiconductor layer on a first semiconductor substrate. The second semiconductor is lattice matched to the first semiconductor substrate such that the second semiconductor layer is subjected to a first directional stress. An active device semiconductor layer is formed over the second semiconductor layer such that the active device semiconductor layer is initially in a relaxed state. One or more trench isolation structures are formed through the active device layer and through the second semiconductor layer so as to relax the second semiconductor layer below the active device layer and impart a second directional stress on the active device layer opposite the first directional stress.

8 Claims, 6 Drawing Sheets

OTHER PUBLICATIONS

Tomohisho Mizuno et al., High-Performance Strained-SOI CMOS Devices Using Thin Film SiGe-On-Insulator Technology, IEEE Transactions on Electron Devices, vol. 50, No. 4, Apr. 2003, pp. 988-994.

Tsutomu Tezuka et al., Ultrathin Body SiGe-On-Insulator pMOSFETs With High-Mobility SiGe Surface Channels, IEEE Transactions on Electron Devices, vol. 50, No. 5, May 2003, pp. 1328-1333.

Haizhou Yin et al., Ultrathin Strained-SOI by Stress Balance on Complaint Substrates and FET Performance, IEEE TRansactions on Electron Devices, vol. 52, No. 10, Oct. 2005, pp. 2207-2214.

* cited by examiner

STRAINED THIN BODY SEMICONDUCTOR-ON-INSULATOR SUBSTRATE AND DEVICE

CROSS-REFERENCE TO RELATED APPLICATION

This application is a divisional of U.S. patent application Ser. No. 12/892,950, filed Sep. 29, 2010, now U.S. Pat. No. 8,124,470, the disclosure of which is incorporated by reference herein in its entirety.

BACKGROUND

The present invention relates generally to semiconductor device manufacturing and, more particularly, to a strained, thin body semiconductor-on-insulator substrate and device.

Semiconductor-on-insulator (SOI) devices, such as silicon-on-insulator (also abbreviated in the art as "SOI") devices, offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of latchup, which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

The gain of a MOS transistor, usually defined by the transconductance ($g_m$), is proportional to the mobility ($\mu$) of the majority carrier in the transistor channel. The current carrying capability, and hence the performance of an MOS transistor is proportional to the mobility of the majority carrier in the channel. The mobility of holes, which are the majority carriers in a P-channel field effect transistor (PFET), and the mobility of electrons, which are the majority carriers in an N-channel field effect transistor (NFET), may be enhanced by applying an appropriate stress to the channel. Existing stress engineering methods greatly enhance circuit performance by increasing device drive current without increasing device size and device capacitance. For example, a tensile stress liner applied to an NFET transistor induces a longitudinal stress in the channel and enhances the electron mobility, while a compressive stress liner applied to a PFET transistor induces a compressive stress in the channel and enhances the hole mobility.

There are several process integration methods for the creation of dual stress films. The underlying theme is the blanket deposition of a first stress layer type, followed by lithography to mask and protect this first stress layer type, an etch to remove the first stress layer type where it is not desired, and then deposition of the second stress layer type. The resulting enhanced carrier mobility, in turn, leads to higher drive currents and therefore higher circuit level performance.

However, as devices continue to scale with future technology nodes, conventional methods such as strain liners lose their effectiveness at tight pitches. Thus, substrate strain engineering is gaining more attention. While strained SOI substrates are available from wafer vendors, their manufacturing is not presently cost effective, as thick, relaxed silicon germanium (SiGe) epitaxy is required.

SUMMARY

In an exemplary embodiment, a method of forming a strained, semiconductor-on-insulator substrate includes forming a second semiconductor layer on a first semiconductor substrate, wherein the second semiconductor layer is lattice matched to the first semiconductor substrate such that the second semiconductor layer is subjected to a first directional stress; forming an active device semiconductor layer over the second semiconductor layer such that the active device semiconductor layer is initially in a relaxed state; and forming one or more trench isolation structures through the active device layer and through the second semiconductor layer so as to relax the second semiconductor layer below the active device layer and impart a second directional stress on the active device layer opposite the first directional stress.

In another embodiment, a method of forming a strained, semiconductor-on-insulator substrate includes preparing a handle wafer by forming a second semiconductor layer on a first semiconductor substrate, wherein the second semiconductor layer is lattice matched to the first semiconductor substrate such that the second semiconductor layer is subjected to a first directional stress; preparing a donor wafer by forming an insulator layer over a bulk semiconductor substrate, the bulk semiconductor substrate having a defect layer adjacent a top surface thereof; bonding the donor wafer to the handle wafer such that the insulator layer of the donor wafer is bonded to the second semiconductor layer of the handle wafer; separating a majority of the donor wafer from the handle wafer along the defect layer, such that a remaining portion of semiconductor material from the donor wafer defines an active device semiconductor layer over the second semiconductor layer such that the active device semiconductor layer is initially in a relaxed state; and forming one or more trench isolation structures through the active device layer and through the second semiconductor layer so as to relax the second semiconductor layer below the active device layer and impart a second directional stress on the active device layer opposite the first directional stress.

In still another embodiment, a strained, semiconductor-on-insulator substrate includes a second semiconductor layer formed on a first semiconductor substrate, wherein the second semiconductor layer is lattice matched to the first semiconductor substrate; an active device semiconductor layer formed over the second semiconductor layer; and one or more trench isolation structures formed through the active device layer and through the second semiconductor layer such that the second semiconductor layer below the active device layer imparts a directional stress on the active device layer.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is a strained SOI substrate and a method of forming the same that uses a relatively thin semiconductor (e.g., SiGe) under thin buried oxide to import strain to the channel. This thin semiconductor layer is initially grown lattice matched to a silicon substrate, and subsequently trenches are etched through the layer to relax the strain therein. In so doing, a mechanical stress is applied to the channel.

Figure 1:
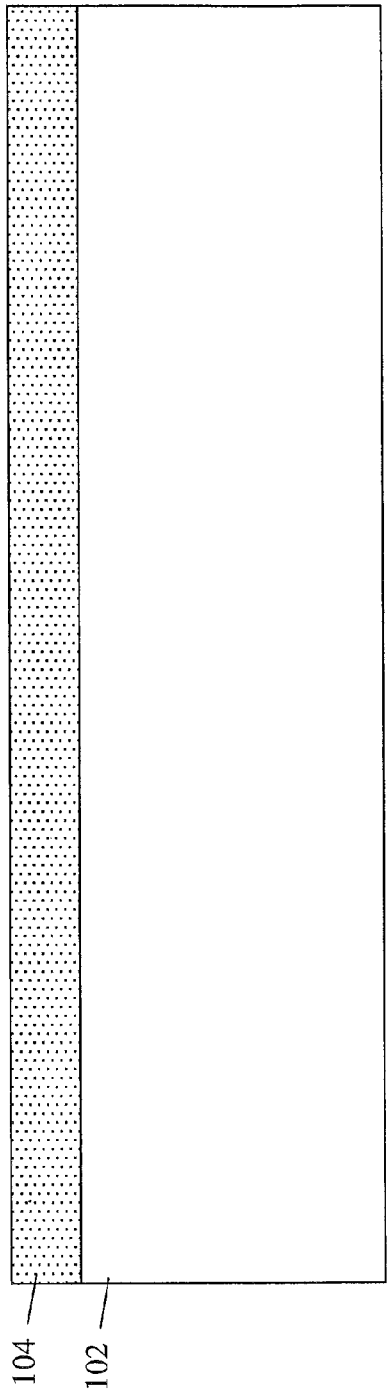
FIG. 1 is cross sectional view of a handle wafer used in an exemplary method of forming a strained SOI substrate, in accordance with an embodiment of the invention.

Referring initially to FIG. 1, there is shown cross sectional view of a handle wafer 100 used in an exemplary method of forming a strained SOI substrate, in accordance with an embodiment of the invention. The handle wafer 100 includes a bulk semiconductor substrate 102, such as silicon (Si) for example, having a second semiconductor layer 104 epitaxially grown thereon. The second semiconductor layer 104 is formed so as to be lattice matched to the substrate 102. For example, if a SiGe semiconductor layer 104 is grown and is lattice matched on the Si substrate, then the SiGe layer will be under compressive strain. Optionally, a thin Si layer (not shown) can be deposited on top of the SiGe layer 104 to help with the quality of the bonding interface.

Figure 2:
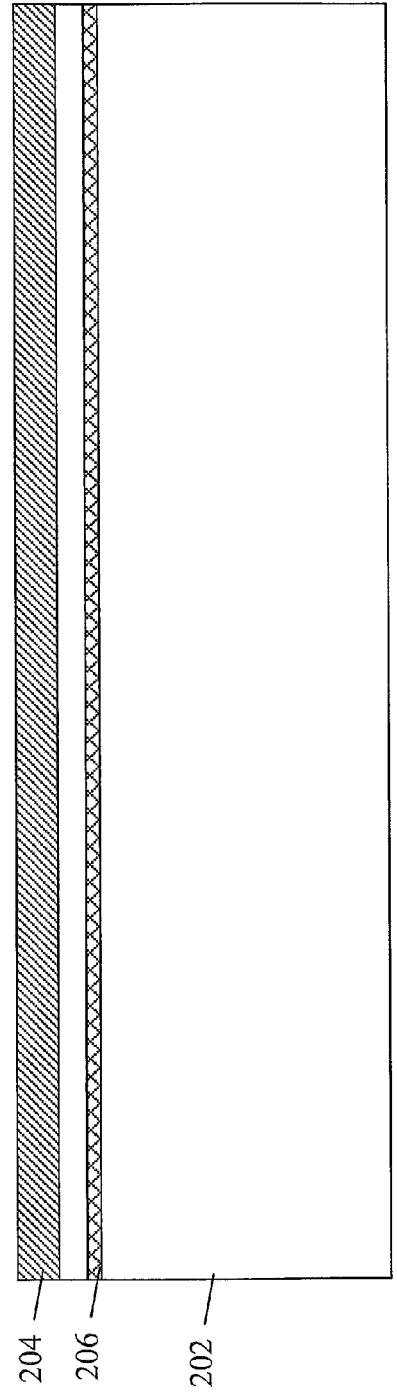
FIG. 2 is cross sectional view of a donor wafer used in an exemplary method of forming a strained SOI substrate, in accordance with an embodiment of the invention.

FIG. 2 is cross sectional view of a donor wafer 200 used in conjunction with the handle wafer 100 of FIG. 1. The donor wafer 200 may be prepared in any suitable manner as known in the art, and includes a bulk substrate (e.g., Si) 202 and a thin oxide layer 204 formed on the substrate 202. As also shown in FIG. 2, the bulk substrate 202 has a defect layer 206 formed therein, a small distance below the upper surface of the substrate 202, to facilitate a subsequent separation of the majority of the substrate 202. In one example, the defect layer 206 is formed by implantation of a species such as hydrogen (H) in accordance with the well-known Smart Cut process.

Figure 3:
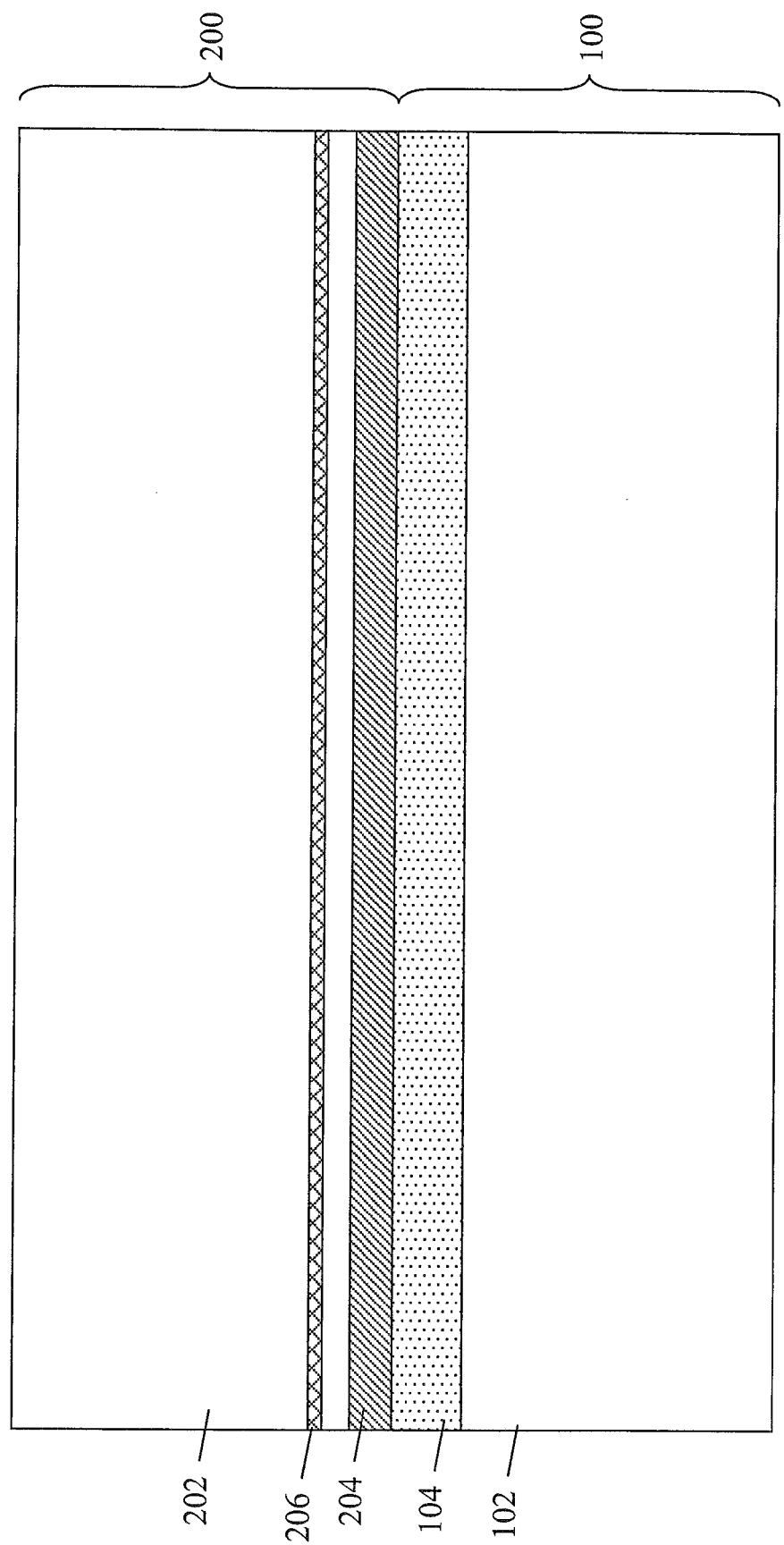
FIG. 3 illustrates bonding of the donor wafer of FIG. 2 to the handle wafer of FIG. 1.
Figure 4:
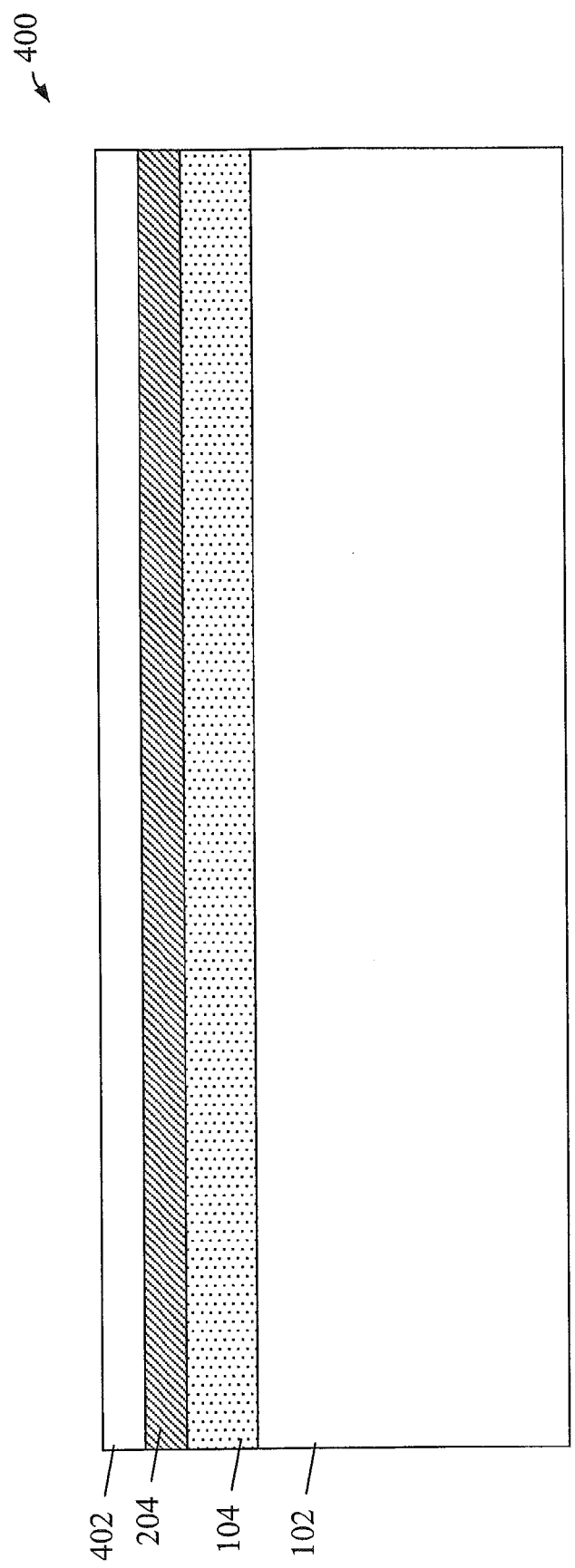
FIG. 4 illustrates removal of the donor wafer to form a thin SOI layer atop the handle wafer.

FIG. 3 illustrates bonding of the donor wafer 200 to the handle wafer 100, such as through thermal annealing. Once bonded, the donor wafer is then removed along the defect layer 206, with the remaining thin Si layer from the donor wafer being planarized to result in the SOI substrate 400 shown in FIG. 4. As is shown in FIG. 4, the thin Si layer 402 defines a thin SOI layer, with the thin oxide layer 204 serving as a buried oxide (BOX) layer that sits atop the second semiconductor layer 104. Here, it will be noted that the second semiconductor layer 104 (SiGe for example) is still under stress and thus the top channel is relaxed to this point.

Figure 5:
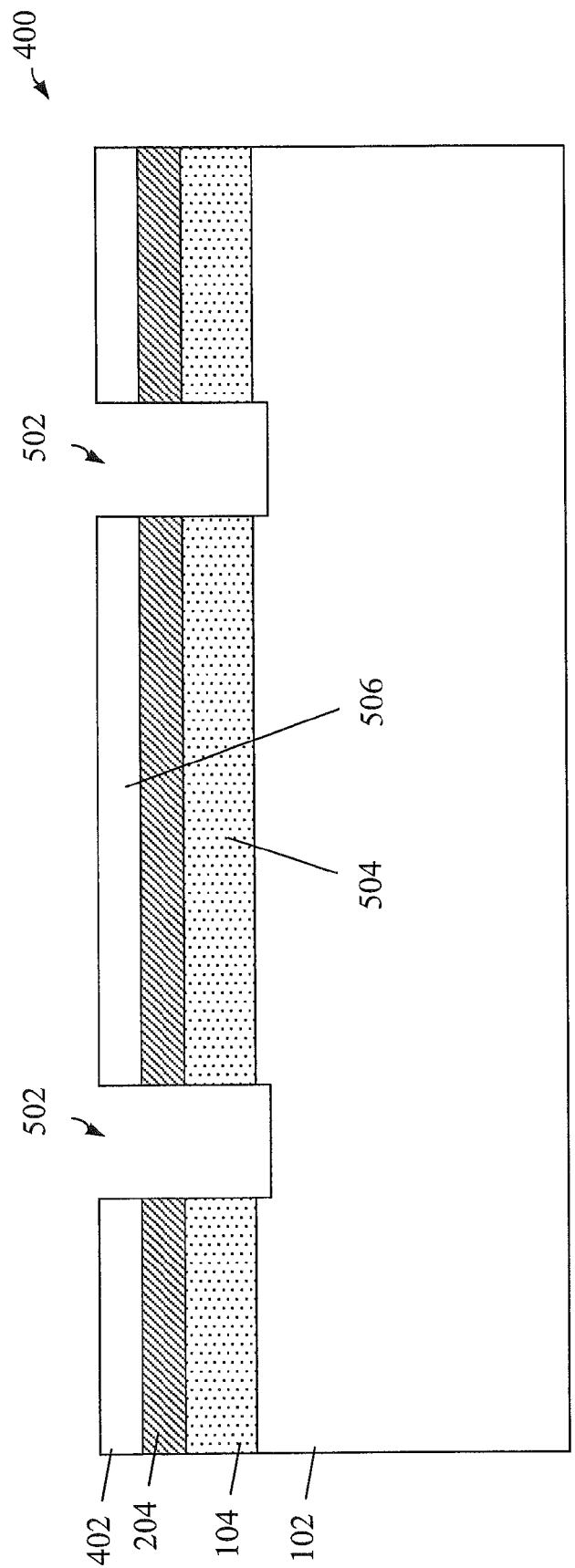
FIG. 5 illustrates forming one or more trenches through the SOI layer, a buried oxide layer and a strained semiconductor layer to relax strain in the semiconductor layer and induce an opposite strain in the channel layer.

Referring now to FIG. 5, the SOI substrate 400 is prepared for device fabrication by etching isolation trenches 502 in the top SOI layer 402, through the buried oxide 204, and through the second semiconductor layer 104. In the embodiment illustrated, the isolation trenches 502 are formed completely through the second semiconductor layer 104, and partially into the bulk substrate 102, although they could be as deep as the second semiconductor layer 104, stopping on the bulk substrate 102. Given certain dimensions of the active device area, for example about 500 nanometers (nm) or less of spacing between adjacent isolation trenches 502 for a SiGe layer, the strain in this segment 504 of the second semiconductor layer 104 is now completely relaxed due to the trench formation. Consequently, a strain of the opposite sign (e.g., tensile) is induced the channel region 506 of the SOI layer 402. In order to efficiently transfer such a strain from the SiGe layer to an SOI layer, the SOI layer 402 should be thinner than the strain-inducing second semiconductor layer 104.

Figure 6:
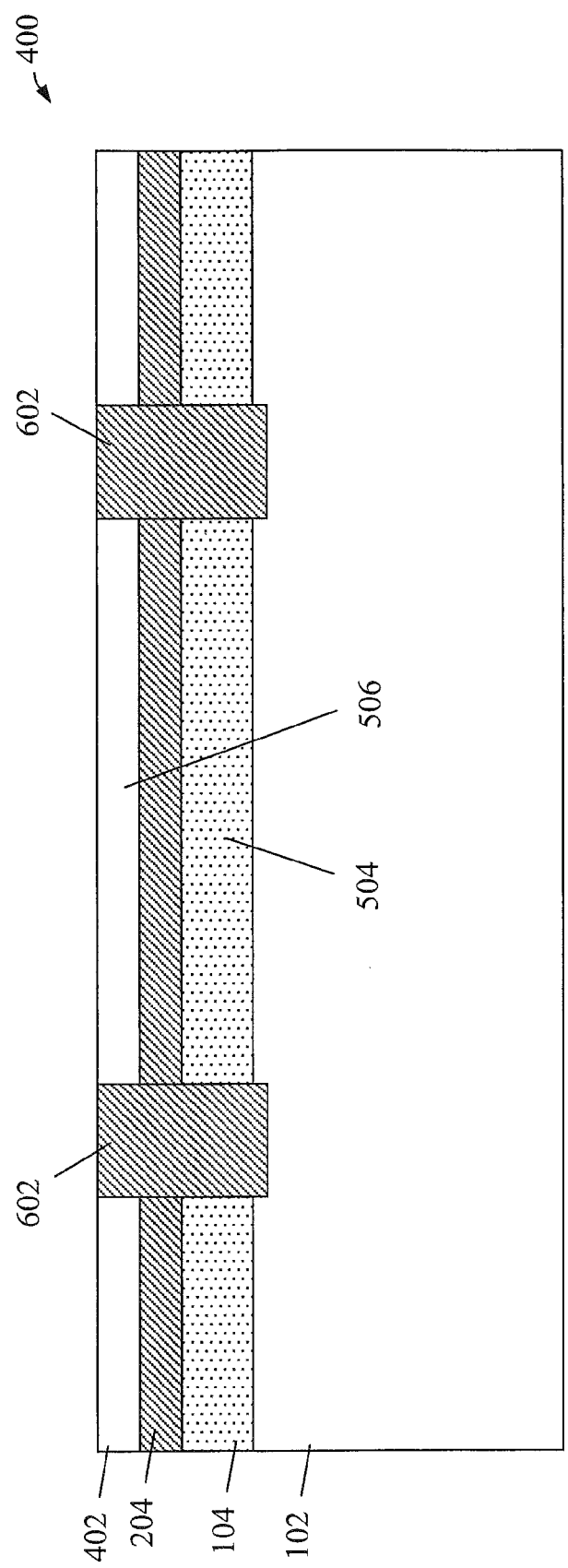
FIG. 6 illustrates filling the one or more trenches with an insulating material.
Figure 7:
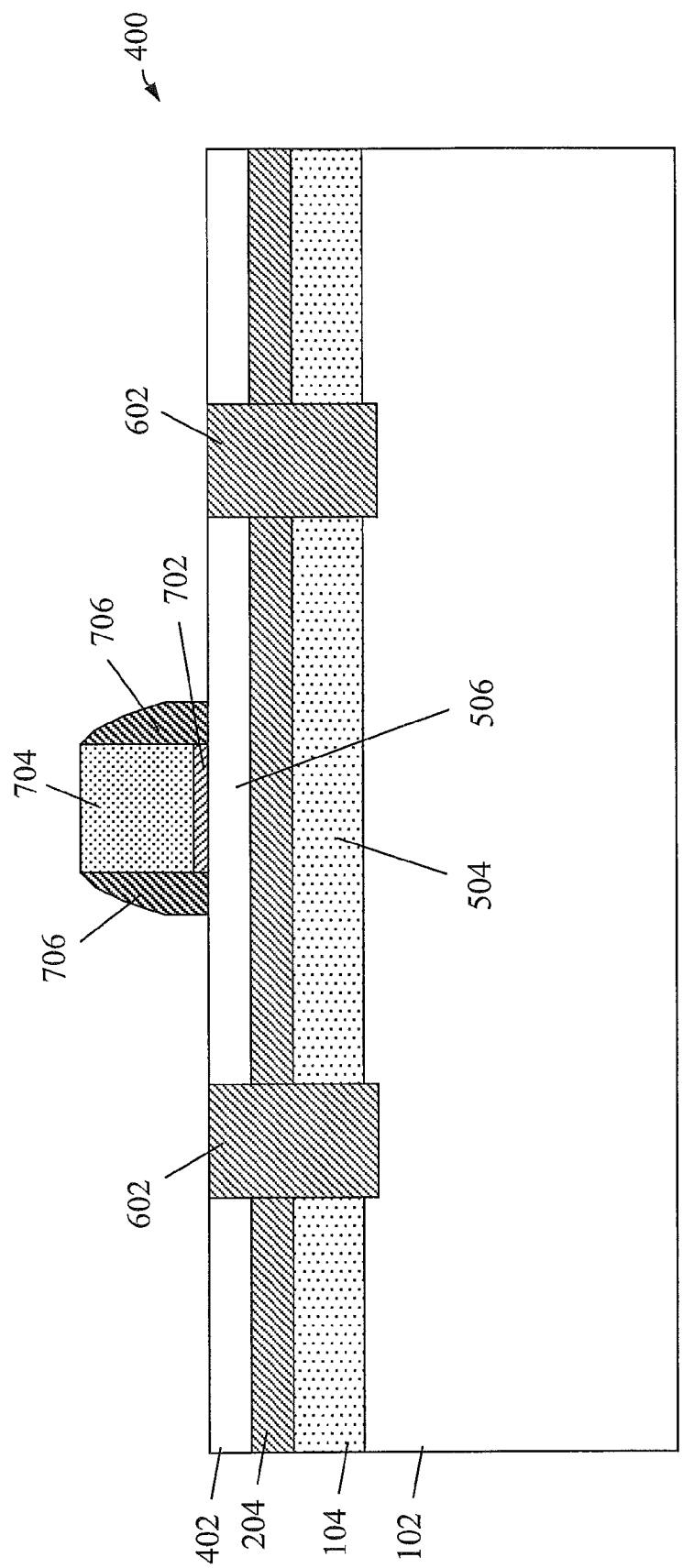
FIG. 7 illustrates forming transistor devices using the strained SOI substrate.

As shown in FIG. 6, the trenches are then filled with a suitable insulating material (e.g., oxide) to form shallow trench isolation regions 602. Again, the segment 504 of the second semiconductor layer 104 remains completely relaxed, while the channel region 506 of the SOI layer 402 is subjected to a tensile stress. Finally, as shown in FIG. 7, conventional CMOS processing may resume, such as by the formation of a gate structure including a gate dielectric layer 702, gate electrode 704 and sidewall spacers 706.

As indicated above, a tensile stress liner applied to an NFET transistor channel induces a longitudinal stress in the channel and thus enhances the electron mobility, while a compressive stress liner applied to a PFET transistor induces a compressive stress in the channel and enhances the hole mobility. Thus, for the above described embodiments where a buried SiGe layer is used to apply tensile strain to the channel, such an example is desirable for the manufacture of NFETs but not PFETs. Consequently, in CMOS devices where both NFETs and PFETs are present, one of several approaches (or a combination thereof) may be used for applying this type of tensile strain for one device polarity.

One such approach would be to etch the trenches only for one polarity of the transistor devices. For example, NFETs may be formed by isolating the active area with trenches, while PFETs are formed in a nested fashion. Alternatively, the trenches may be formed using two depths such that the trenches do not pass through the buried semiconductor layer where tensile strain on the channel region is not desired. That is, for NFET devices, the adjacent isolation trenches pass through the buried semiconductor layer, while for the PFET devices, the adjacent isolation trenches do not pass through the buried semiconductor layer.

Another possible approach may be to add embedded stressors adjacent the channel regions of PFET devices by recessing through the top SOI layer, the BOX layer, and into the substrate. Still another possibility is to amorphize the buried semiconductor layer for the second transistor polarity with an implant species such that it does not impart a stress on the channel once isolation trenches are formed therein.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A strained, semiconductor-on-insulator substrate, comprising:

a second semiconductor layer formed on a first semiconductor substrate, wherein the second semiconductor is lattice matched to the first semiconductor substrate;

an active device semiconductor layer formed over the second semiconductor layer; and one or more trench isolation structures formed through the active device layer and through the second semiconductor layer such that the second semiconductor layer below the active device layer imparts a directional stress on the active device layer.

2. The substrate of claim 1, wherein the first semiconductor substrate comprises silicon (Si) and the second semiconductor layer comprises silicon germanium (SiGe).

3. The substrate of claim 2, wherein the directional stress comprises a tensile stress.

4. The substrate of claim 1, further comprising a buried insulator layer formed between the second semiconductor layer and the active device layer.

5. The substrate of claim 4, further comprising an insulating material filling the one of more trench isolation structures, and one or more transistor devices between adjacent trench isolation structures.

6. The substrate of claim 5, wherein adjacent trench isolation structures are separated by a distance of about 500 nanometers (nm) or less.

7. The substrate of claim 6, wherein the one or more transistor devices comprises N-channel field effect transistors (NFETs).

8. The substrate of claim 1, wherein the active device layer is thinner than the second semiconductor layer.

* * * * *